(12) United States Patent
Deligianni et al.

(10) Patent No.: US 10,396,144 B2
(45) Date of Patent: Aug. 27, 2019

(54) MAGNETIC INDUCTOR STACK INCLUDING MAGNETIC MATERIALS HAVING MULTIPLE PERMEABILITIES

(71) Applicant: International Business Machines Corporation, Armonk, NY (US)

(72) Inventors: Hariklia Deligianni, Alpine, NJ (US); Bruce B. Doris, Hartsdale, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/494,871

(22) Filed: Apr. 24, 2017

(65) Prior Publication Data
US 2018/0308920 A1  Oct. 25, 2018

(51) Int. Cl.
| B32B 37/14 | (2006.01) |
| H01F 1/147 | (2006.01) |
| H01F 17/00 | (2006.01) |
| H01F 41/02 | (2006.01) |
| H01F 41/04 | (2006.01) |
| H01L 49/02 | (2006.01) |
| H01F 27/245 | (2006.01) |

(52) U.S. Cl.
CPC .............. *H01L 28/10* (2013.01); *B32B 37/14* (2013.01); *H01F 1/14716* (2013.01); *H01F 17/0013* (2013.01); *H01F 27/245* (2013.01); *H01F 41/0233* (2013.01); *H01F 41/041* (2013.01); *B32B 2307/206* (2013.01); *B32B 2307/208* (2013.01)

(58) Field of Classification Search
CPC ... H01L 28/10; B32B 37/14; B32B 2307/208; B32B 2307/206; H01F 41/0233; H01F 27/2804; H01F 27/245; H01F 1/14716; H01F 41/041; H01F 2027/2809
USPC .......................................... 257/531; 336/200
See application file for complete search history.

(56) References Cited

U.S. PATENT DOCUMENTS

| 7,380,328 B2 | 6/2008 | Ahn et al. |
| 7,847,668 B2 | 12/2010 | Lai et al. |
| 8,093,981 B2 | 1/2012 | Chung |
| 8,323,728 B2 | 12/2012 | Iorio et al. |

(Continued)

OTHER PUBLICATIONS

Deligianni et al., "Stress Management for Thick Magnetic Film Inductors," U.S. Appl. No. 15/599,754, filed May 19, 2017.

(Continued)

*Primary Examiner* — Bo Fan
(74) *Attorney, Agent, or Firm* — Cantor Colburn LLP; Vazken Alexanian

(57) ABSTRACT

Provided is an inductor structure. In embodiments of the invention, the inductor structure includes a first laminated stack. The first laminated stack includes layers of an insulating material alternating with layers of a first magnetic material. The inductor structure includes a laminated second stack formed on the first laminated stack. The second laminated stack includes layers of the insulating material alternating with layers of a second magnetic material. The second magnetic material has a greater permeability than does the first magnetic material.

11 Claims, 10 Drawing Sheets

(56) References Cited

U.S. PATENT DOCUMENTS

| | | | |
|---|---|---|---|
| 2008/0036536 A1* | 2/2008 | Khorramabadi | H01F 17/0013 330/252 |
| 2008/0284552 A1* | 11/2008 | Lim | H01F 17/0006 336/200 |
| 2012/0236528 A1 | 9/2012 | Le et al. | |
| 2012/0319236 A1* | 12/2012 | Chen | H01L 23/5227 257/531 |
| 2014/0216939 A1 | 8/2014 | Fontana, Jr. et al. | |
| 2015/0171157 A1 | 6/2015 | Sturcken et al. | |
| 2016/0260708 A1 | 9/2016 | Herget et al. | |

OTHER PUBLICATIONS

Deligianni et al., "Stress Management for Thick Magnetic Film Inductors," U.S. Appl. No. 16/107,102, filed Aug. 21, 2018.

Deligianni et al., "Magnetic Inductor Stacks," U.S. Appl. No. 15/403,292, filed Jan. 11, 2017.

Deligianni et al., "Magnetic Inductor Stacks," U.S. Appl. No. 15/800,702, filed Nov. 1, 2017.

List of IBM Patents or Patent Applications Treated as Related; (Appendix P), Date Filed Sep. 28, 2018; 2 pages.

Gao, "Significantly Enhanced Inductance and Quality Factor of GHz Integrated Magnetic Solenoid Inductors With FeGaB/Al2O3 Multilayer Films", IEEE Transactions on Electron Devices, vol. 61, No. 5, May 2014, pp. 1470-1476, IEEE.

Iakubov et al., "Control over magnetic spectrum of multilayer magnetic film metamaterial," AIP Advances, vol. 5, No. 7, 2015, 077116, 7 pages.

Deligianni et al.; "Magnetic Inductor Stack Including Magnetic Materials Having Multiple Permeabilities"; U.S. Appl. No. 15/966,202, filed Apr. 30, 2018.

List of IBM Patents or Patent Applications Treated as Related; Date Filed: Apr. 30, 2018, 2 pages.

Deligianni et al.; "Laminated Magnetic Inductor Stack With High Frequency Peak Quality Factor"; U.S. Appl. No. 15/479,615, filed Apr. 5, 2017.

Deligianni et al.; "Magnetic Inductor Stack Including Insulating Material Having Multiple Thicknesses"; U.S. Appl. No. 15/584,766, filed May 2, 2017.

Deligianni et al.; "Magnetic Inductor With Multiple Magnetic Layer Thicknesses"; U.S. Appl. No. 15/473,725, filed Mar. 30, 2017.

Deligianni et al.; "Magnetic Inductor With Shape Anisotrophy"; U.S. Appl. No. 15/476,147, filed Mar. 31, 2017.

List of IBM Patents or Patent Applications Treated as Related; Date Filed: Jan. 15, 2018, 2 pages.

* cited by examiner

MAGNETIC INDUCTOR STACK INCLUDING MAGNETIC MATERIALS HAVING MULTIPLE PERMEABILITIES

BACKGROUND

The present invention relates in general to on-chip magnetic devices, and more specifically, to on-chip magnetic structures, e.g., a laminated magnetic inductor stack, including magnetic materials having multiple permeabilities.

Inductors, resistors, and capacitors are the main passive elements constituting an electronic circuit. Inductors are used in circuits for a variety of purposes, such as in noise reduction, inductor-capacitor (LC) resonance calculators, and power supply circuitry. On-chip magnetic inductors are important passive elements in applications such as on-chip power converters and radio frequency (RF) integrated circuits. Inductors having magnetic core materials with thicknesses ranging several 100 nm to a few microns can be implemented to achieve a high energy density. For example, to achieve the high energy storage required for power management, on-chip inductors can require relatively thick magnetic stacks or yokes (e.g., several microns or more).

SUMMARY

Provided is an inductor structure for use in a semiconductor device. In embodiments of the invention, the inductor structure includes a first laminated stack. The first laminated stack includes layers of an insulating material alternating with layers of a first magnetic material. The inductor structure includes a second laminated stack formed on the first laminated stack. The second laminated stack includes layers of the insulating material alternating with layers of a second magnetic material. The second magnetic material has a greater permeability than does the first magnetic material.

Embodiments of the invention are directed to inductor structures for use in a semiconductor device. A non-limiting example of the inductor structure includes a bottom coil, layers of an insulating material, layers of a first magnetic material, and layers of a second magnetic material. The relative permeability of the second magnetic material is greater than the relative permeability of the first magnetic material.

Embodiments of the invention are directed to a method of forming an inductor structure for use in a semiconductor device. A non-limiting example of the method includes forming a first laminated stack. Forming the first laminated stack includes forming layers of an insulating material alternating with forming layers of a first magnetic material. A second laminated stack is formed on the first laminated stack. Forming the laminated second stack includes forming layers of the insulating material alternating with forming layers of a second magnetic material. The second magnetic material has a greater permeability than does the first magnetic material.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
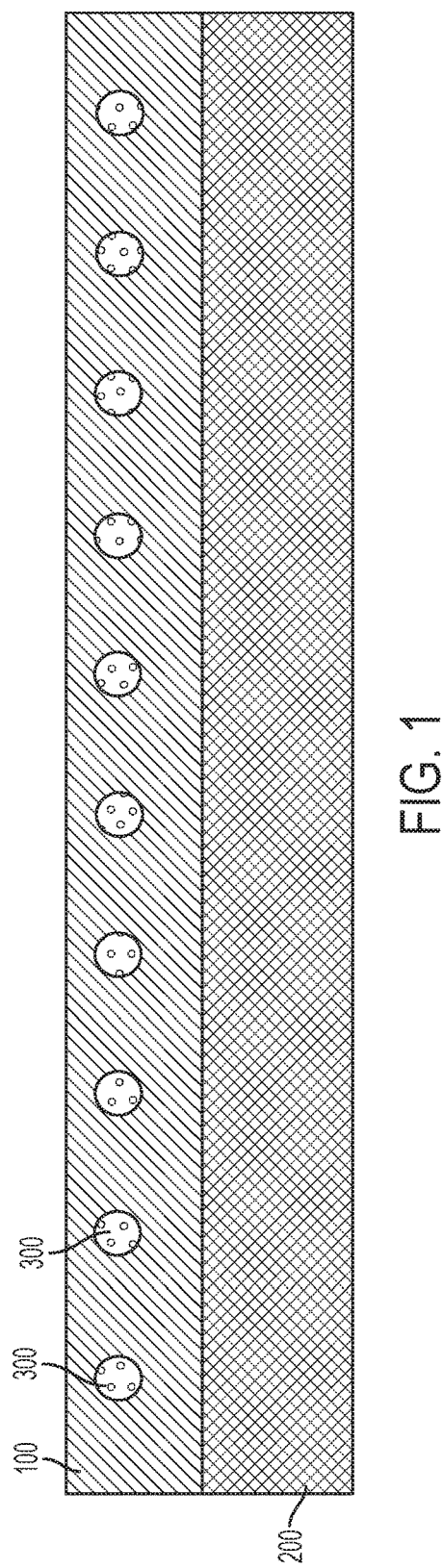
FIG. 1 depicts a cross-sectional view of an inductor structure after a processing stage according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, as previously discussed herein, inductors are used in circuits for a variety of purposes, such as in noise reduction, inductor-capacitor (LC) resonance calculators, and power supply circuitry. Examples of inductor integration include a transformer, which can include metal wires or lines (conductors) formed parallel to each other by silicon processing techniques directed to forming metal features. The inductor structures can be formed about the parallel metal lines to form a closed magnetic circuit and to provide a large inductance and magnetic coupling among the metal lines. The inclusion of the magnetic material and the enclosure, e.g., substantial or complete enclosure, of the metal lines can increase the magnetic coupling between the metal lines and the inductor for a given size of the inductor. The magnetic materials of an inductor can also be useful for RF and wireless circuits as well as power converters and EMI noise reduction.

Among the various types of inductors the laminated film-type inductor is widely used in applications requiring miniaturization and high current due to the reduced size and improved inductance per coil turn of these inductors relative to other inductor types. Laminated film-type inductors include laminated stacks that can be formed, for example, by depositing alternating layers of magnetic and dielectric material. Lamination of the magnetic stacks minimizes magnetic loss.

Permeability ($\mu$) is the degree of magnetization that a material obtains in response to an applied magnetic field. Relative permeability ($\mu_r$) is the ratio of the permeability of a medium to the permeability of free space ($\mu_0$). Thus, relative permeability is a dimensionless quantity that is proportional to permeability. The quality factor (also known as "Q") of an inductor is the ratio of its inductive reactance to its resistance at a given frequency, and is a measure of its efficiency. Incorporating magnetic materials with high permeability in an inductor can increase Q. Materials with high Q, however, can also increase magnetic losses. Regions or laminated stacks closer to the metal coils or wire wrapped around the inductor can be subject to higher magnetic field, and consequently, are more sensitive or susceptible to magnetic loss.

The maximum attainable quality factor for a given inductor across all frequencies is known as peak Q (or maximum Q). Some applications can require the peak Q to be at a low frequency and other applications can require the peak Q to be at a high frequency. While the wires of the inductor can be redesigned to modulate or control the frequency of the peak Q, there are significant costs associated with any redesign, including at minimum mask making, and a redesign can involve changing multiple regions in addition to the coils.

Turning now to an overview of aspects of the present invention, one or more embodiments of the invention provide methods and structures configured to minimize magnetic loss and improve Q, and to modulate or adjust the frequency at which Q is at a peak. In one or more embodiments of the invention, magnetic loss can be reduced by including at least two magnetic materials with different $\mu$. A magnetic material with relatively low $\mu$ can be located closer to the inductor coils than a magnetic material with a relatively high $\mu$. In this manner the frequency of peak Q can be modulated. Methods for forming an inductor structure and inductor structures in accordance with embodiments of the invention are described in detail below by referring to the accompanying drawings in FIGS. 1-10.

FIG. 1 depicts a cross-sectional view of the inductor structure after a processing stage according to one or more embodiments of the invention. As depicted in FIG. 1, with reference, for example, to a solenoid inductor, an oxide 100 can be deposited on wafer 200, a bottom coil 300 can be formed, and oxide 100 can be deposited on top of the coil 300. Wafer 200 can have undergone semiconductor front end of line processing (FEOL), middle of the line processing (MOL), and back end of the line processing (BEOL).

FEOL processes can include, for example, wafer preparation, isolation, well formation, gate patterning, spacer, extension and source/drain implantation, and silicide formation. The MOL can include, for example, gate contact formation. In the BEOL interconnects can be fabricated with, for example, a dual damascene process using plasma-enhanced CVD (PECVD) deposited interlayer dielectric (ILDs), PVD metal barriers and electrochemically plated conductive wire materials. The wafer 200 can include a silicon substrate or silicon handle. In some embodiments of the invention, the wafer 200 can include, for example, Ge, SiGe, GaAs, InP, AlGaAs, or InGaAs.

Figure 2:
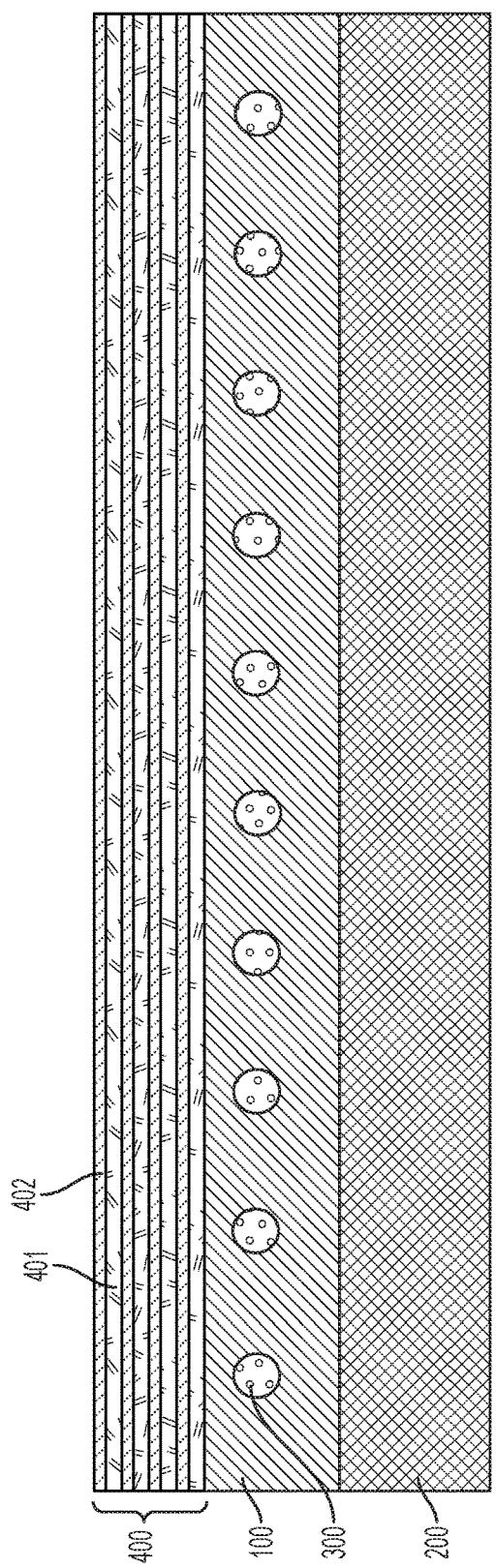
FIG. 2 depicts a cross-sectional view of the inductor structure after a processing stage according to one or more embodiments of the present invention.

FIG. 2 depicts a cross-sectional view of the inductor structure after a processing stage according to one or more embodiments of the invention. As depicted in FIG. 2, a first laminated stack 400 including first magnetic material layers 401 and dielectric material layers 402 can be deposited on oxide 100.

The first laminated stack 400 including first magnetic material layers 401 and dielectric material layers 402 can include a plurality of alternating first magnetic material layers 401 and dielectric material layers 402. For ease of discussion, reference is made to a first laminated stack including four first magnetic material layers 401 alternating with four dielectric material layers 402. In some embodiments of the invention, the first laminated stack can include any number of first magnetic material layers 401 alternating with a corresponding number of dielectric material layers 402. For example, the first laminated stack can include two magnetic material layers, five magnetic material layers, eight magnetic material layers, or any number of magnetic material layers, along with a corresponding number of dielectric material layers.

Each of the first magnetic material layers 401 in first laminated stack 400 can have a thickness between about 50 nm and about 500 nm, for example, about 50 nm to about 200 nm. The first magnetic material layers 401 can be deposited through vacuum deposition technologies (i.e., sputtering) or electrodepositing through an aqueous solution.

The first magnetic layers 401 can be made of any suitable magnetic material known in the art, such as, for example, a ferromagnetic material, soft magnetic material, iron alloy, nickel alloy, cobalt alloy, ferrites, plated materials such as permalloy, or any suitable combination of these materials. The first magnetic material layers 401 can include, for example, a Co containing magnetic material, FeTaN, FeNi, FeAlO, or combinations thereof. Inductor core structures using these materials can have low eddy losses, a high magnetic permeability, and a high saturation flux density.

The permeability of a material can change with deposition conditions of the material. The magnetic material included in the first laminated stack 400 can have a relatively low permeability compared to a magnetic material included in second laminated stack layers 500, to be described in further detail below. For example, the magnetic material included in the first magnetic material layers 401 can have a relative permeability of about 50 to about 1,000. Relative permeabilities for some of the magnetic materials listed above can be found in Table 1, below.

TABLE 1

| Material | Relative Permeability |
|---|---|
| CoFeHfO | 140-170 |
| CoFeSiO | 200 |
| CoFeAlO | 300 |
| FeAlO | 500-700 |
| CoZrTa | 600-780 |
| CoZrNb | 850 |
| CoFeB | 800-1,000 |
| FeCoN | 1200 |

The dielectric material layers 402 in the first laminated stack 400 can include dielectric materials such as, for example, silicon dioxide ($SiO_2$), silicon nitride (SiN), silicon oxynitride ($SiO_xN_y$), magnesium oxide (MgO), or aluminum oxide ($AlO_2$). The bulk resistivity and the eddy current loss of the magnetic structure can be controlled by the dielectric material layers 402. Each of the dielectric material layers 402 can isolate each of the magnetic material layers 401 from each other in the first laminated stack 400. The dielectric material layers 402 can be deposited using a deposition process, including, for example, PVD, CVD, PECVD, or a combination thereof.

The dielectric material layers 402 in the first laminated stack 400 can each have a thickness of about 1 nm to about 500 nm and can each be about one-half or greater than the thickness of each of the magnetic material layers 401. For example, each of the dielectric material layers 402 in the first laminated stack 400 can have a thickness of about 5 nm to about 10 nm.

Figure 3:
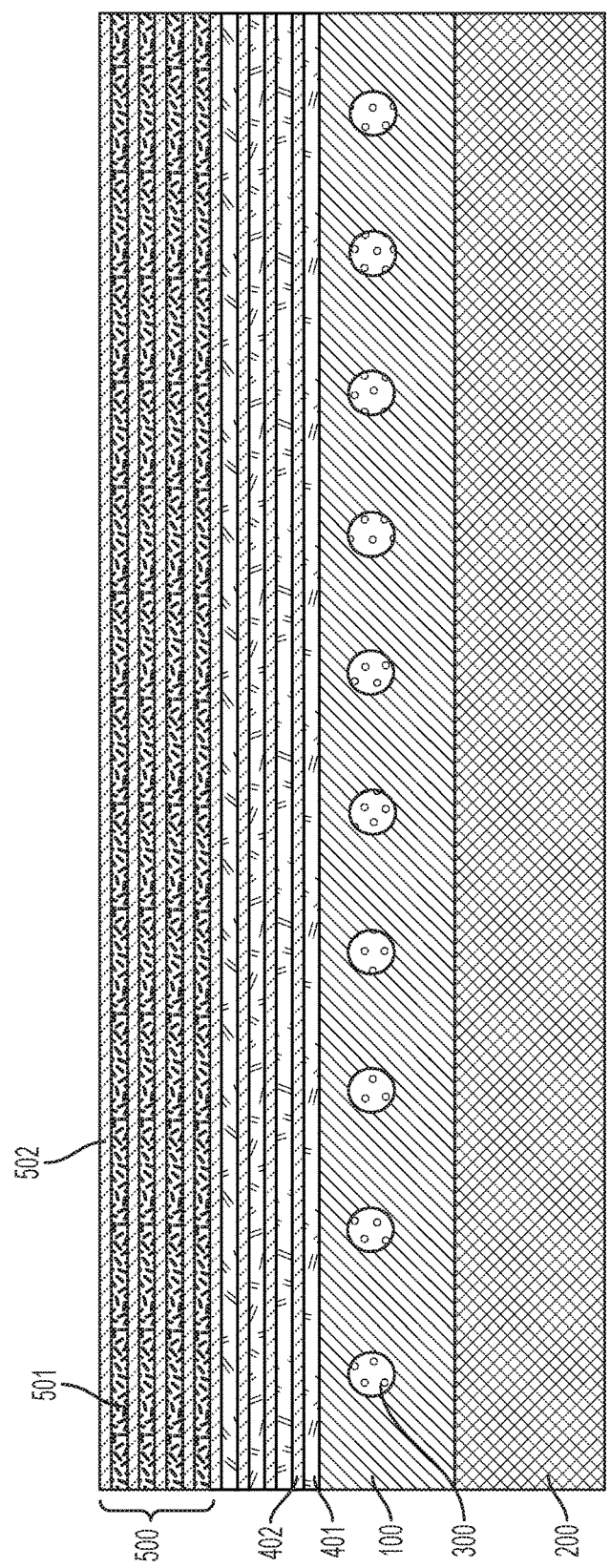
FIG. 3 depicts a cross-sectional view of the inductor structure after a processing stage according to one or more embodiments of the present invention.

FIG. 3 depicts a cross-sectional view of the inductor structure after a processing stage according to one or more embodiments of the invention. As depicted in FIG. 3, a second laminated stack 500 including second magnetic material layers 501 and dielectric material layers 502 can be deposited on the first laminated stack 400 including first magnetic material layers 401 and dielectric material layers 402. In some embodiments of the invention, dielectric material layers 502 can include a same material as dielectric material layers 402.

The second laminated stack 500 including second magnetic material layers 501 and dielectric material layers 502 can include a plurality of alternating second magnetic material layers 501 and dielectric material layers 502. For example, the second laminated stack including second magnetic material layers 501 and dielectric material layers 502 can include four second magnetic material layers 501 alternating with four dielectric material layers 502.

For ease of discussion, reference is made to a second laminated stack 500 including four second magnetic material layers 501 alternating with four dielectric material layers 502. In some embodiments of the invention, second laminated stack 500 can include any number of second magnetic material layers 501 alternating with a corresponding number of dielectric material layers 502. For example, second laminated stack 500 can include two magnetic material layers, five magnetic material layers, eight magnetic material layers, or any number of magnetic material layers, along with a corresponding number of dielectric material layers.

Each of the second magnetic material layers 501 in the second laminated stack can have a thickness of about 50 nm to about 500 nm, for example, about 50 nm to about 200 nm. The second magnetic material layers 501 can be deposited through vacuum deposition technologies (i.e., sputtering) or electrodepositing through an aqueous solution.

The second magnetic material layers 501 can include, for example, any Co containing magnetic material, FeTaN, FeNi, FeAlO, or combinations thereof. Inductor core structures from these materials can have low eddy losses, a high magnetic permeability, and a high saturation flux density.

The magnetic material included in the second magnetic material layers 501 can have a different permeability than the magnetic material included in the first magnetic material layers 401. In some embodiments of the invention, the magnetic material included in the second magnetic material layers 501 can have a greater permeability than the magnetic material included in the first magnetic material layers 401. For example, the magnetic material included in the second magnetic material layers 501 can have a relative permeability of about 500 to about 3,000. In some embodiments of the invention, a Co containing magnetic material which has a higher permeability than another Co containing magnetic material can be included in the second magnetic material layers 501 and a low permeability Co containing material can be included in the first magnetic material layers 401.

The dielectric material layers 502 in the second laminated stack 500 can include dielectric materials such as, for example, silicon dioxide ($SiO_2$), silicon nitride (SiN), silicon oxynitride ($SiO_xN_y$), magnesium oxide (MgO), or aluminum oxide ($AlO_2$). The bulk resistivity and the eddy current loss of the magnetic structure can be controlled by the dielectric material layers 502. Each of the dielectric material layers 502 can isolate each of the magnetic material layers from each other in the stack. The dielectric material layers 502 can be deposited using a deposition process, including, for example, PVD, CVD, PECVD, or a combination thereof.

The dielectric material layers 502 in the second laminated stack 500 can each have a thickness of about 1 nm to about 500 nm and can each be about one half or greater than each of the magnetic material layer thicknesses. For example, each of the dielectric material layers 502 in the second laminated stack 500 can have a thickness of about 5 nm to about 10 nm. In some embodiments of the invention, a total thickness of the first laminated stack and the second laminated stack can be about 1 micron to about 10 microns.

Figure 4:
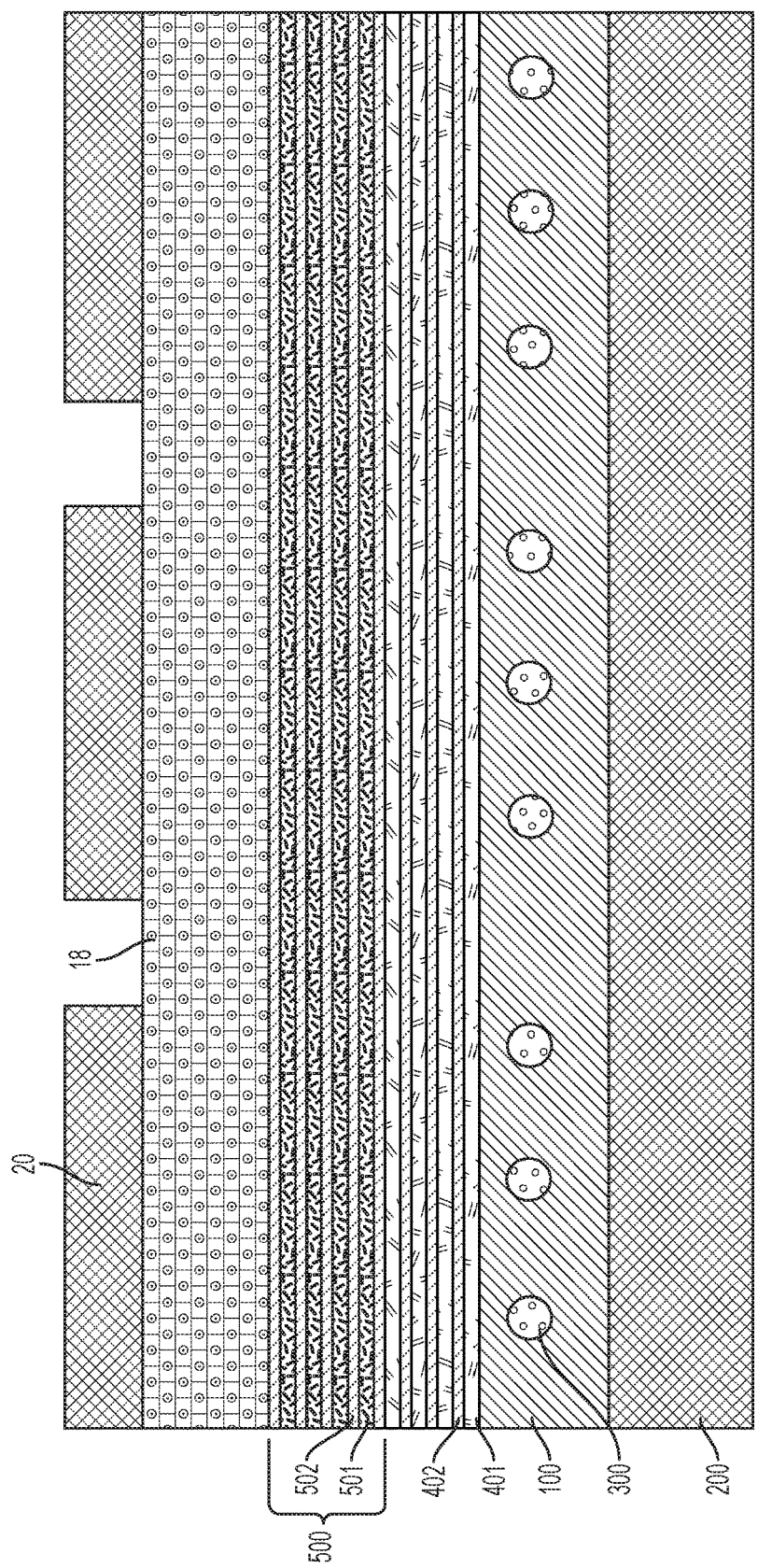
FIG. 4 depicts a cross-sectional view of the inductor structure after a processing stage according to one or more embodiments of the present invention.

FIG. 4 depicts a cross-sectional view of the inductor structure after a processing stage according to one or more embodiments of the invention. As depicted in FIG. 4, a hard mask 18 can be deposited on the second laminated stack 500 including second magnetic material layers 501 and dielectric material layers 502. A resist image 20 can be formed, e.g., lithographically, on the hard mask 18 to provide additional structures and connections.

Figure 5:
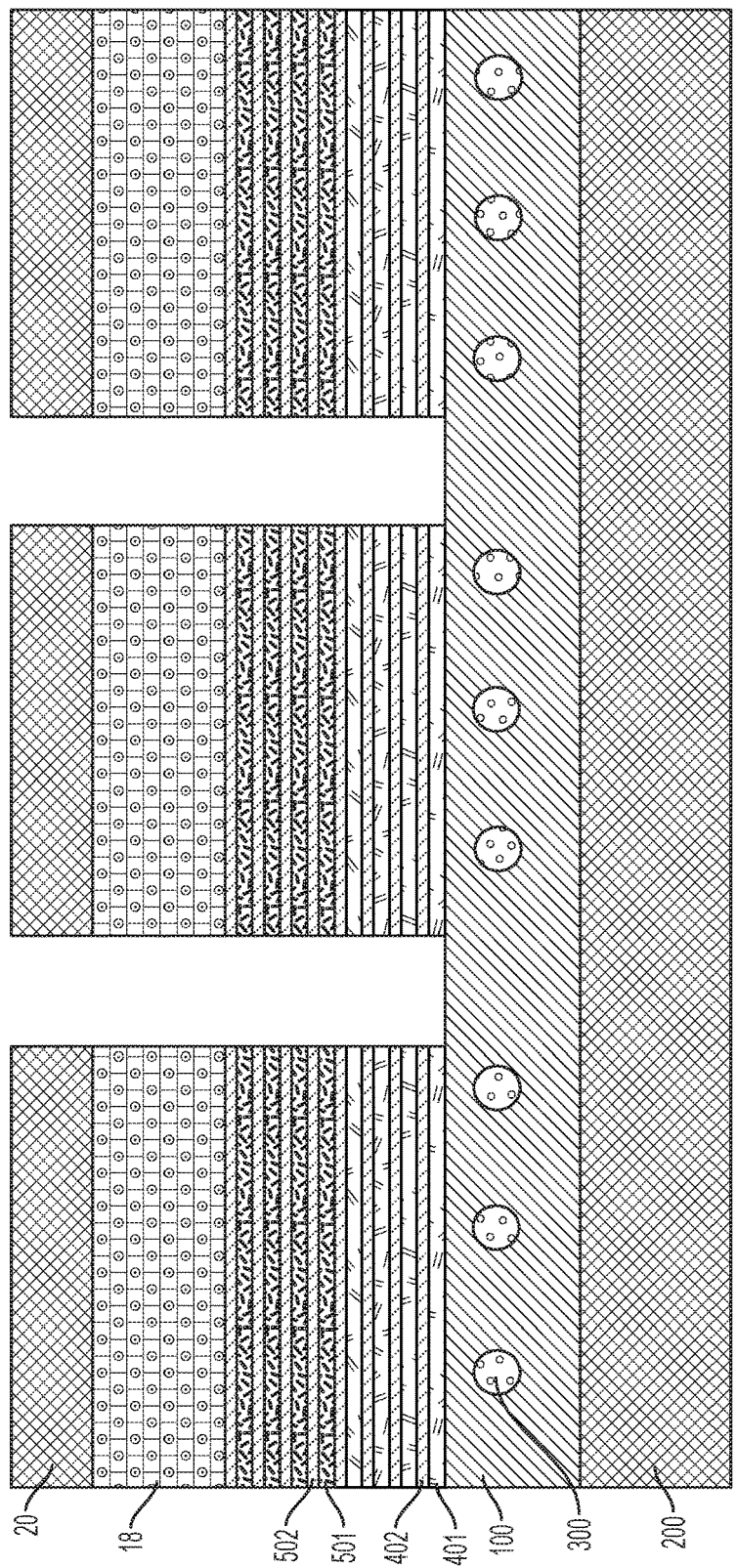
FIG. 5 depicts a cross-sectional view of the inductor structure after a processing stage according to one or more embodiments of the present invention.

FIG. 5 depicts a cross-sectional view of the inductor structure after a processing stage according to one or more embodiments of the invention. As depicted in FIG. 5, the hard mask 18, second laminated stack 500, and first laminated stack 400 can be etched. Any known method for patterning laminated stacks can be used, such as, for example, a wet etch, a dry etch, or a combination of sequential wet and/or dry etches. In some embodiments of the present invention, the hard mask 18, the first laminated stack 400, and the second laminated stack 500 are etching using a reactive ion etch (RIE). In some embodiments of the present invention, the RIE is selective to the oxide 100.

Figure 6:
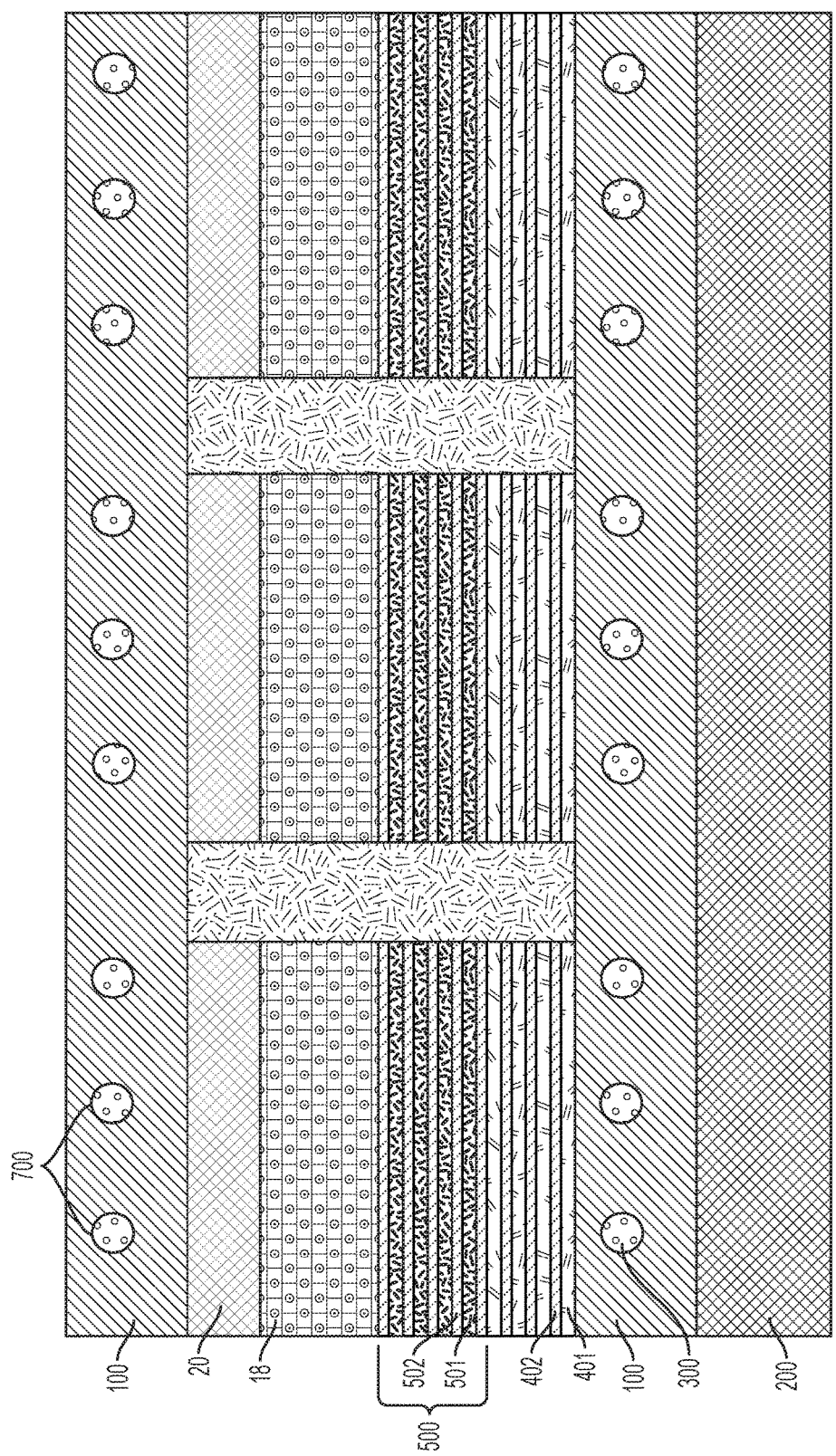
FIG. 6 depicts a cross-sectional view of the inductor structure after a processing stage according to one or more embodiments of the present invention.

FIG. 6 depicts a cross-sectional view of the inductor structure after a processing stage according to one or more embodiments of the invention. As depicted in FIG. 6, oxide 100 can be deposited and top coils 700 can be formed. As previously described herein, regions or laminated stacks closer to metal coils (such as the top coils 700 and bottom coils 300) can be more susceptible to magnetic loss, which can affect peak Q. Inclusion of magnetic materials with more than one permeability can help modulate the peak Q to a desired frequency. In some embodiments of the invention, a magnetic material with relatively low μ can be located closer to the coils than a magnetic material with a relatively high μ. For example, in some embodiments of the invention, a thickness of the first laminated stack including a magnetic material with relatively low μ and/or the second laminated stack including a magnetic material with relatively high μ can be adjusted to control the location of different magnetic materials relative to the coils, and to modulate the peak Q to a desired frequency.

Figure 7:
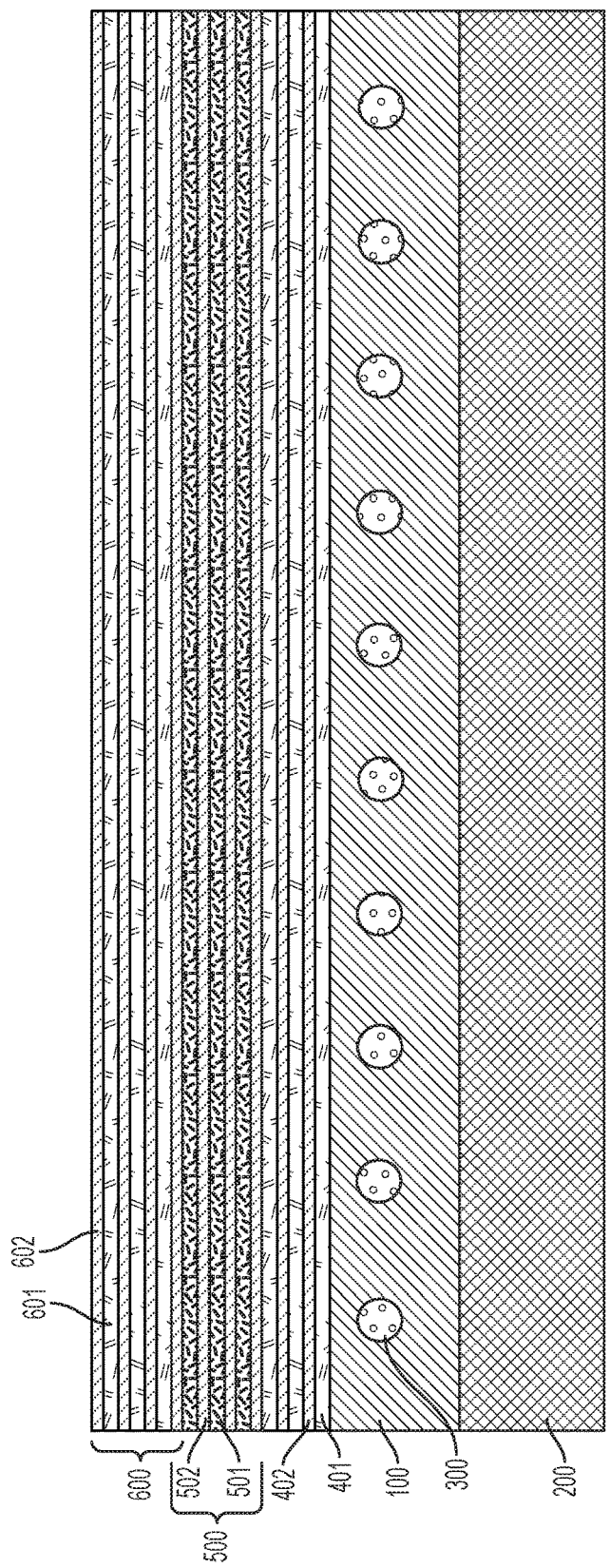
FIG. 7 depicts a cross-sectional view of the inductor structure after a processing stage according to one or more embodiments of the present invention.

FIG. 7 depicts a cross-sectional view of an inductor structure according to one or more embodiments of the invention. The operation depicted in FIG. 7 can follow the operation depicted in FIG. 3. As depicted in FIG. 7, a third laminated stack 600 including third magnetic material layers and third dielectric material layers can be deposited on the second laminated stack including second magnetic material layers 501 and dielectric material layers 502.

The first laminated stack 400 including first magnetic material layers 401 and dielectric material layers 402 can include a plurality of alternating first magnetic material layers 401 and dielectric material layers 402. For example, the first laminated stack 400 including first magnetic material layers 401 and dielectric material layers 402 can include three first magnetic material layers 401 alternating with three dielectric material layers 402.

For ease of discussion, reference is made to a first laminated stack 400 including three first magnetic material layers 401 alternating with three dielectric material layers 402. In some embodiments of the invention, first laminated stack 400 can include any number of first magnetic material layers 401 alternating with a corresponding number of dielectric material layers 402. For example, the first laminated stack 400 can include two magnetic material layers, five magnetic material layers, eight magnetic material layers, or any number of magnetic material layers, along with a corresponding number of dielectric material layers.

A second laminated stack 500 including second magnetic material layers 501 and dielectric material layers 502 can be deposited on the first laminated stack 400 including first magnetic material layers 401 and dielectric material layers 402. The second laminated stack 500 including second magnetic material layers 501 and dielectric material layers 502 can include a plurality of alternating second magnetic material layers 501 and dielectric material layers 502. For example, the second laminated stack 500 including second magnetic material layers 501 and dielectric material layers 502 can include three second magnetic material layers 501 alternating with three dielectric material layers 502.

For ease of discussion, reference is made to a second laminated stack 500 including three second magnetic material layers 501 alternating with three dielectric material layers 502. In some embodiments of the invention, the second laminated stack 500 can include any number of second magnetic material layers 501 alternating with a corresponding number of dielectric material layers 502. For example, the second laminated stack 500 can include two magnetic material layers, five magnetic material layers, eight magnetic material layers, or any number of magnetic material layers, along with a corresponding number of dielectric material layers.

A third laminated stack 600 including third magnetic material layers 601 and third dielectric material layers 602 can be deposited on the second laminated stack 500 that includes second magnetic material layers 501 and dielectric material layers 502. In some embodiments of the invention, dielectric material layers 602 can include a same material as dielectric material layers 402 and/or dielectric material layers 502.

The third laminated stack 600 including third magnetic material layers 601 and third dielectric material layers 602 can include a plurality of alternating third magnetic material layers 601 and dielectric material layers 602. For example, the third laminated stack 600 including third magnetic material layers 601 and dielectric material layers 602 can include three third magnetic material layers 601 alternating with three dielectric material layers 602.

For ease of discussion, reference is made to a third laminated stack 600 including three third magnetic material layers 601 alternating with three dielectric material layers 602. In some embodiments of the invention, the third laminated stack 600 can include any number of third magnetic material layers 601 alternating with a corresponding number of dielectric material layers 602. For example, the third laminated stack 600 can include two magnetic material layers, five magnetic material layers, eight magnetic material layers, or any number of magnetic material layers, along with a corresponding number of dielectric material layers.

Each of the third magnetic material layers 601 in the third laminated stack 600 can have a thickness of about 50 nm to about 500 nm, for example, about 50 nm to about 200 nm. The third magnetic material layers 601 can be deposited through vacuum deposition technologies (i.e., sputtering) or electrodepositing through an aqueous solution.

The third magnetic material layers 601 can include, for example, a Co containing magnetic material, FeTaN, FeNi, FeAlO, or combinations thereof. Inductor core structures from these materials can have low eddy losses, a high magnetic permeability, and a high saturation flux density.

The magnetic material included in the third magnetic material layers 601 can have a different permeability than the magnetic material included in the second magnetic material layers 501. In some embodiments of the invention, the magnetic material included in the second magnetic material layers 501 can have a greater permeability than the magnetic material included in the third magnetic material layers 601. For example, the magnetic material included in the third magnetic material layers 601 can have a relative permeability of about of about 50 to about 1,000. The magnetic material included in the third magnetic material layers 601 can be the same as or different from the magnetic material included in the first magnetic material layers 401.

The dielectric material layers 602 in the third laminated stack can include dielectric materials such as, for example, silicon dioxide ($SiO_2$), silicon nitride (SiN), silicon oxynitride ($SiO_xN_y$), magnesium oxide (MgO), or aluminum oxide ($AlO_2$). The bulk resistivity and the eddy current loss of the magnetic structure can be controlled by the dielectric material layers 602. Each of the dielectric material layers 602 can isolate each of the magnetic material layers from each other in the stack. The dielectric material layers 602 can be deposited using a deposition process, including, for example, PVD, CVD, PECVD, or a combination thereof.

The dielectric material layers 602 in the third laminated stack can each have a thickness of about 1 nm to about 500 nm and can each be about one half or greater than each of the magnetic material layer thicknesses. For example, each of the dielectric material layers 602 in the third laminated stack can have a thickness of about 5 nm to about 10 nm. In some embodiments of the invention, a total thickness of the first laminated stack, the second laminated stack, and the third laminated stack can be about 1 micron to about 10 microns.

Figure 8:
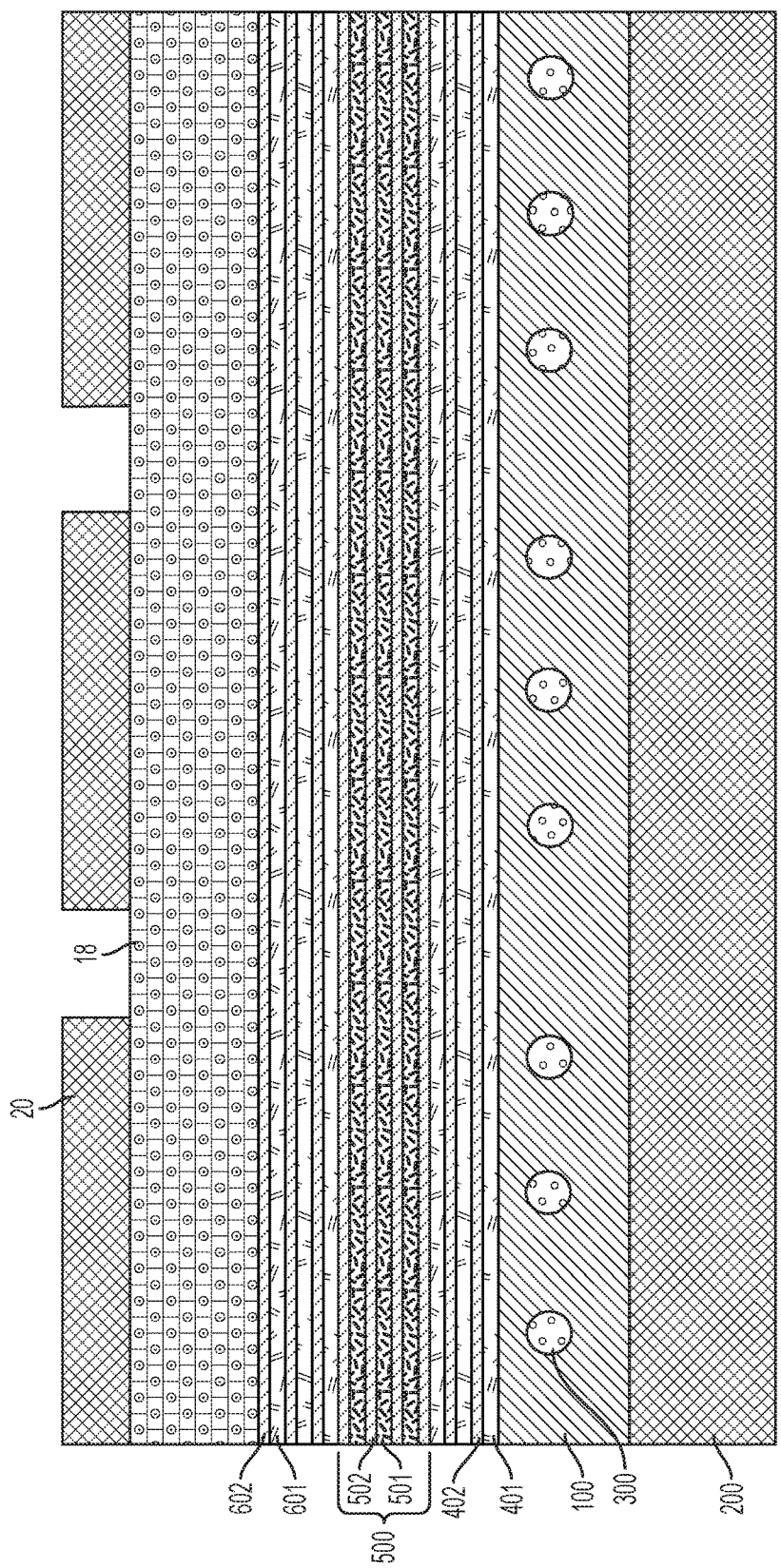
FIG. 8 depicts a cross-sectional view of the inductor structure after a processing stage according to one or more embodiments of the present invention.

FIG. 8 depicts a cross-sectional view of the inductor structure after a processing stage according to one or more embodiments of the invention. As depicted in FIG. 8, a hard mask 18 can be deposited on the third laminated stack 600 including second magnetic material layers 601 and dielectric material layers 602, and a resist image 20 can be formed, e.g., lithographically, on the hard mask 18 to provide additional structures and connections.

Figure 9:
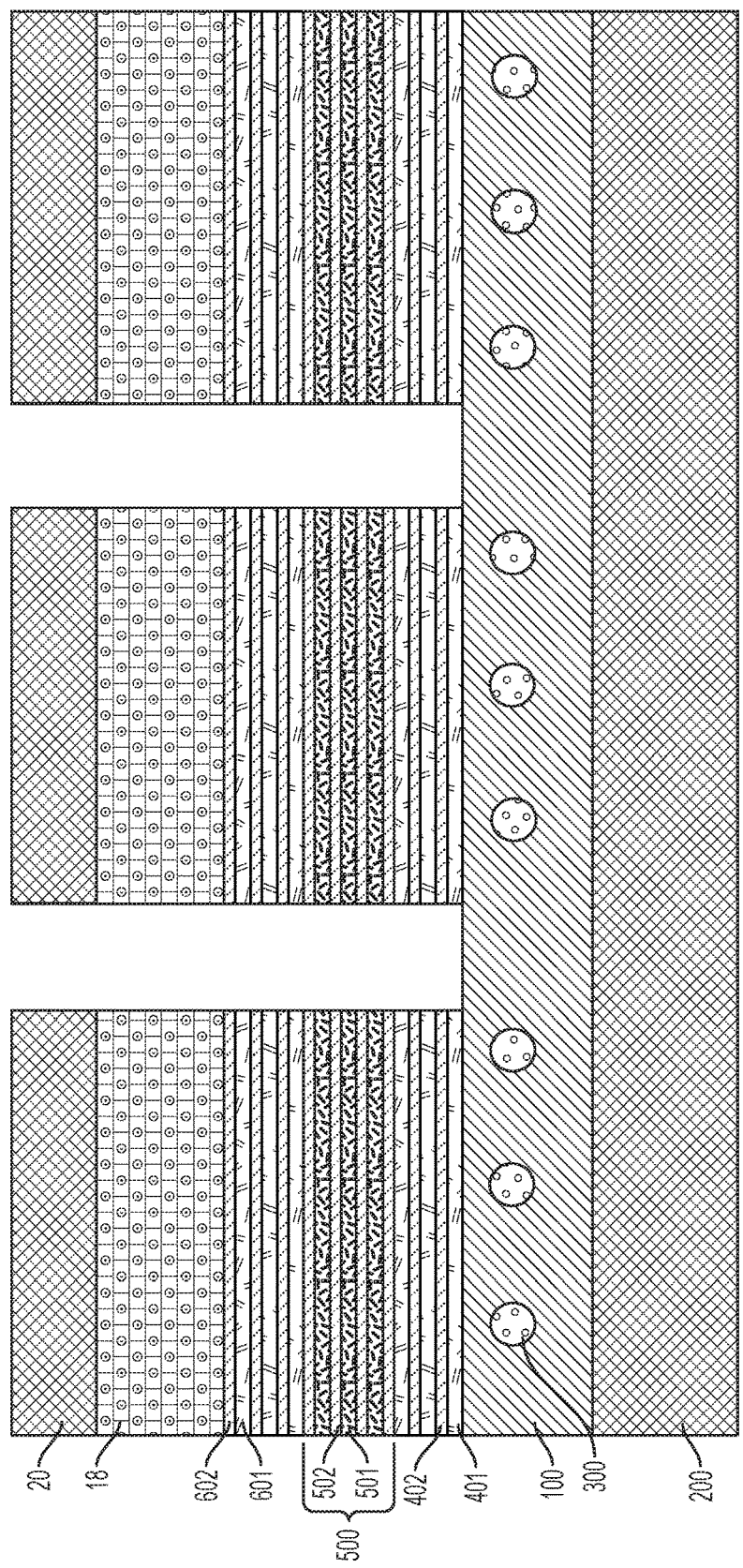
FIG. 9 depicts a cross-sectional view of the inductor structure after a processing stage according to one or more embodiments of the present invention.

FIG. 9 depicts a cross-sectional view of the inductor structure after a processing stage according to one or more embodiments of the invention. As depicted in FIG. 9, the hard mask 18 and the first, second, and third laminated stacks 400, 500, and 600, respectively, can be etched. Any known method for patterning laminated stacks can be used, such as, for example, a wet etch, a dry etch, or a combination of sequential wet and/or dry etches. In some embodiments of the present invention, the hard mask 18 and the first, second, and third laminated stacks 400, 500, and 600 are etching using a reactive ion etch (RIE). In some embodiments of the present invention, the RIE is selective to the oxide 100.

Figure 10:
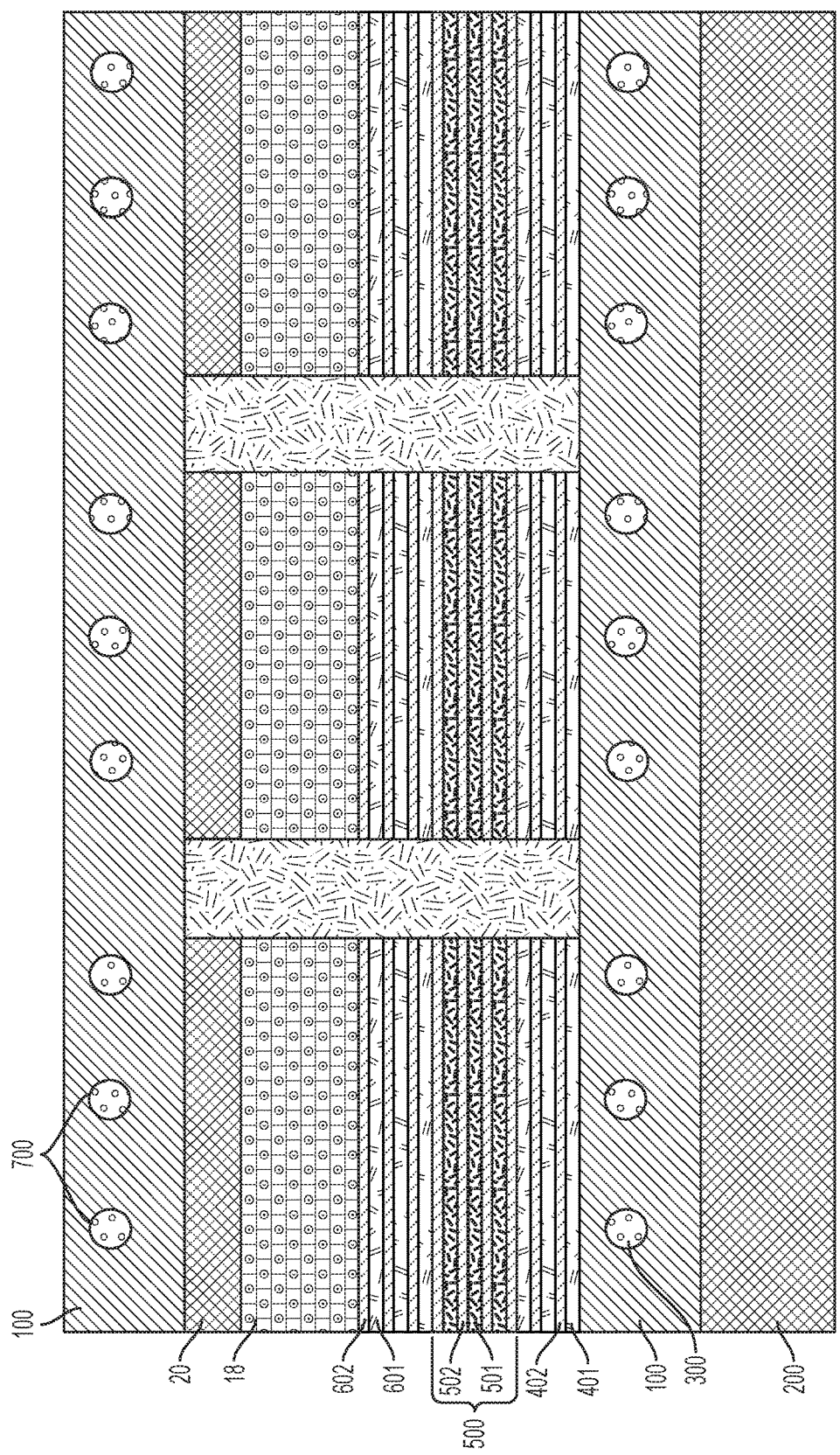
FIG. 10 depicts a cross-sectional view of the inductor structure after a processing stage according to one or more embodiments of the present invention.

FIG. 10 depicts a cross-sectional view of the inductor structure after a processing stage according to one or more embodiments of the invention. As depicted in FIG. 10, oxide 100 can be deposited and top coils 700 can be formed. As noted above, regions closer to the metal coils can be more sensitive to magnetic loss, which can affect peak Q, and in some embodiments of the invention, a thickness of the first laminated stack 400 including a magnetic material with relatively low p, the second laminated stack 500 including a magnetic material with relatively high p, and/or the third laminated stack 600 including a magnetic material with relatively low p can be adjusted to control the location of different magnetic materials having different relative to the coils, and to modulate the peak Q to a desired frequency.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. An inductor structure, comprising:
   a laminated first stack including:
      layers having insulating material; and
      layers having a first magnetic material, the layers having insulating material alternating with the layers having the first magnetic material; and
   a laminated second stack including:
      layers having second insulating material; and
      layers having a second magnetic materials, the second magnetic materials having at least two different permeabilities,
   wherein the layers having the second insulating material alternate with the layers having the second magnetic material, the second magnetic material having a permeability larger than that of the first magnetic material, and
   wherein the first and second magnetic materials are selected from the group consisting of a Co containing magnetic material, FeTaN, and FeNi.

2. A laminated first stack including:
   the layers having insulating material; and
   layers having a first magnetic material, the layers having insulating material alternating with the layers having the first magnetic material; and
   a laminated second stack including:
      the layers having insulating material; and
      layers having a second magnetic material, the layers having insulating material alternating with the layers having the second magnetic material, the second magnetic material having a permeability larger than that of the first magnetic material.

3. The inductor structure of claim 2, further comprising a substrate, the laminated first stack being between the laminated second stack and the substrate.

4. The inductor structure of claim 3, comprising:
   a laminated third stack including:
      the layers having insulating material; and
      layers having a third magnetic material, the layers having insulating material alternating with the layers having the third magnetic material, the second magnetic material having a permeability larger than that of the third magnetic material, the laminated second stack being between the laminated first stack and the laminated third stack.

5. The inductor structure of claim 4, wherein the first magnetic material is a same magnetic material as the third magnetic material.

6. The inductor structure of claim 1, wherein the magnetic materials include a magnetic material having a relative permeability of between about 500 to about 3,000.

7. An inductor structure, comprising:
   a laminated first stack including:
      layers having insulating material; and
      layers including a first magnetic material, the layers including insulating material alternating with the layers including the first magnetic material;
   a laminated second stack including:
      layers having insulating material; and
      layers having a second magnetic material having a relative permeability of about 500 to about 3,000, the layers including insulating material alternating with the layers including the second magnetic material, the first magnetic material having a permeability smaller than that of the second magnetic material.

8. The inductor structure of claim 7, wherein the magnetic materials are selected from the group consisting of a Co containing magnetic material, FeTaN, and FeNi.

9. The inductor structure of claim 7, further comprising a substrate, the laminated first stack being between the laminated second stack and the substrate.

10. The inductor structure of claim 9, comprising:
    a laminated third stack including:
       the layers having insulating material; and
       layers having a third magnetic material, the layers having insulating material alternating with the layers having the third magnetic material, the third magnetic material having a permeability smaller than that of the second magnetic material, the laminated second stack being between the laminated first stack and the laminated third stack.

11. The inductor structure of claim 10, wherein the first magnetic material is a same magnetic material as the third magnetic material.

* * * * *